United States Patent
Cho

(10) Patent No.: US 7,211,871 B2
(45) Date of Patent: May 1, 2007

(54) TRANSISTORS OF SEMICONDUCTOR DEVICES AND METHODS OF FABRICATING THE SAME

(75) Inventor: Yong Soo Cho, Daejeon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 90 days.

(21) Appl. No.: 11/027,518

(22) Filed: Dec. 30, 2004

(65) Prior Publication Data
US 2005/0139932 A1 Jun. 30, 2005

(30) Foreign Application Priority Data
Dec. 31, 2003 (KR) .................. 10-2003-0102038

(51) Int. Cl.
*H01L 29/76* (2006.01)
(52) U.S. Cl. ..................................... 257/408; 257/336
(58) Field of Classification Search ............... 257/336, 257/408
See application file for complete search history.

(56) References Cited

U.S. PATENT DOCUMENTS 5,736,435 A * 4/1998 Venkatesan et al. ........ 438/151
5,879,998 A 3/1999 Krivokapic
6,528,847 B2 3/2003 Liu
6,753,230 B2 6/2004 Sohn et al.

OTHER PUBLICATIONS

Lee, Jung-Ho et al., *Laser Thermal Annealed SSR well Prior to Epi-channel Growth (LASPE) for 70 nm nFETs*, Electron Devices Meeting, 2000. IEDM Technical Digest. International, pp. 441-444.

* cited by examiner

*Primary Examiner*—Doug Menz
(74) *Attorney, Agent, or Firm*—Saliwanchik, Lloyd & Saliwanchik

(57) ABSTRACT

Transistors and methods of fabricating transistors are disclosed. A disclosed method comprises forming an inversion epitaxial layer on a silicon substrate; forming a hard mask on the inversion epitaxial layer; depositing a silicon epitaxial layer over the inversion epitaxial layer; forming a trench through the silicon epitaxial layer by removing the hard mask; forming reverse spacers on the sidewalls of the trench by filling the trench with an insulating layer and etching the insulating layer; forming a gate electrode over the reverse spacers; forming pocket-well regions and LDD regions in the silicon substrate by performing ion implantations; forming spacers on the sidewalls of the gate electrode; forming source and drain regions in the silicon substrate by performing an ion implantation; and forming a silicide layer on the gate electrode and the source and drain regions.

5 Claims, 2 Drawing Sheets

TRANSISTORS OF SEMICONDUCTOR DEVICES AND METHODS OF FABRICATING THE SAME

FIELD OF THE DISCLOSURE

The present disclosure relates generally to semiconductor devices and, more particularly, to transistors of semiconductor devices and methods of fabricating the same.

BACKGROUND

In a metal-oxide-semiconductor (MOS) transistor such as a MOS field-effect-transistor (MOSFET), electric current flows through a surface region under a gate electrode and a gate oxide when an electric field is applied to the source and drain junction regions while a gate charge is applied. The surface region through which the electric current flows is known as a channel. The characteristics of a MOSFET are determined by a dopant concentration in the channel. More specifically, it is very important to precisely dope impurities into the channel region because device characteristics such as the threshold voltage of the transistor and the drain current are subject to the dopant concentration.

Conventional channel doping is achieved by performing well ion implantation, channel ion implantation, or threshold ion implantation. Channel structures formed by such ion implantation include a flat channel in which a dopant concentration is uniform through the whole region of the channel, a buried channel which is formed at a predetermined distance from the top surface of a semiconductor substrate, and a retrograde channel which has a vertically increasing doping profile from the top surface of the channel. Retrograde channels are widely used for high performance microprocessors requiring a channel length less than 0.2 μm. In such a context, the retrograde channel is generally formed by heavy ion implantation using indium (In), arsenic (As), or antimony (Sb). The retrograde channel is suitable for high performance MOSFET devices with high driving current characteristics because a low dopant concentration in its surface increases the surface mobility of an electric current.

As the degree of integration of a semiconductor device increase, the channel length is shortened, and a very thin channel is required. However, conventional ion implantation technology cannot achieve a retrograde channel less than 50 nm in depth. To solve such a problem, an epitaxial channel has been suggested. However, the epitaxial channel has not achieved an improvement in the current on-off characteristics because it is difficult to control the loss and diffusion of the channel dopants due to an epitaxial layer formation process and a later thermal treatment process.

The most ideal channel doping method may embody a δ-doped epitaxial channel. However, according to the reported findings, both doped and undoped epitaxial layers cannot be made into a δ-doped epitaxial channel less than 30 nm in depth because of later dopant diffusion.

To solve such a problem, a method for preventing diffusion of dopants in a δ-doped layer has been suggested in Lee and Lee, *Laser Thermal Annealed SSR Well Prior to Epi-Channel Growth (LASPE) for 70 nm nFET*, IEDM 2000. The suggested method performs channel doping by using an ultra-low energy ion implantation and an instant laser annealing. According to the suggested method, the instant laser annealing controls the diffusion and loss of dopants during a selective epitaxial growth.

However, the laser power for the laser annealing may cause partial melting of the silicon substrate surface, thereby deteriorating the surface roughness and causing crystal defects. Therefore, the laser annealing method is not applicable to practical semiconductor device manufacturing processes.

FIG. 1 is a cross-sectional view of a conventional transistor having a super steep retrograde (SSR) epitaxial channel. Although conventional transistor fabrication technology has reduced the depth of the channel by forming a retrograde channel 7 as shown in FIG. 1, it has failed to substantially reduce the length of the channel.

DETAILED DESCRIPTION

Figure 1:
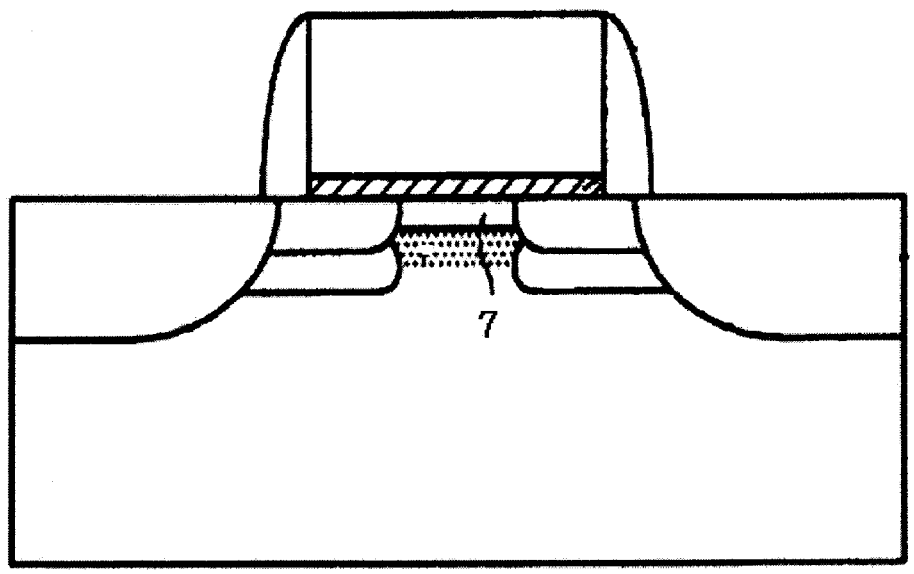
FIG. 1 is a cross-sectional view of a conventional transistor having an SSR epitaxial channel.
Figure 2A:
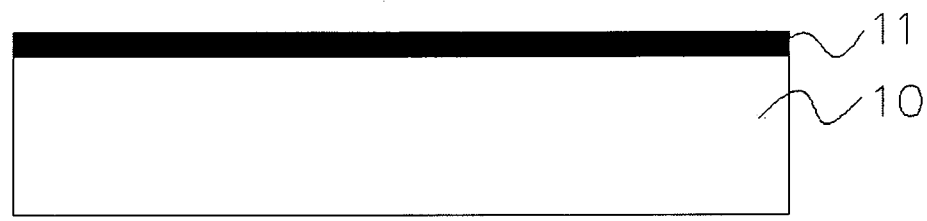
FIGS. 2a through 2e are cross-sectional views illustrating an example process of fabricating a transistor of a semiconductor device having an SSR epitaxial channel and reverse spacers performed in accordance with the teachings of the present invention.

FIGS. 2a through 2e are cross-sectional views illustrating an example process of fabricating a transistor of a semiconductor device having an SSR epitaxial channel and reverse spacers. Referring to FIG. 2a, an inversion epitaxial layer 11 is formed over a silicon substrate 10. The inversion epitaxial layer 11 is used as an SSR epitaxial channel.

Figure 2B:
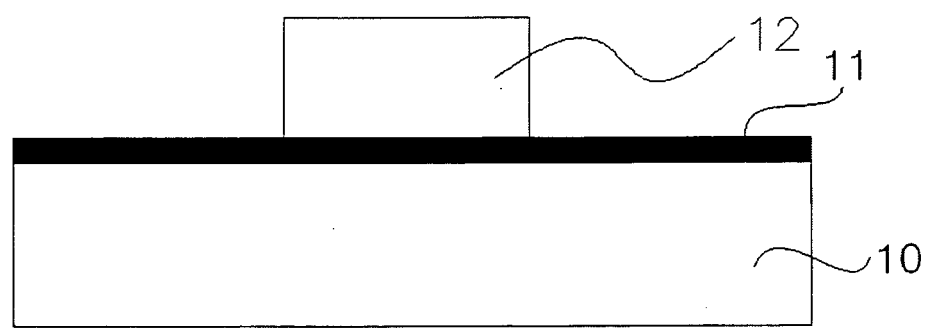

Referring to FIG. 2b, a hard mask 12 is formed on the inversion epitaxial layer 11. The hard mask 12 covers an area for reverse spacers to be formed by a later unit process.

Figure 2C:
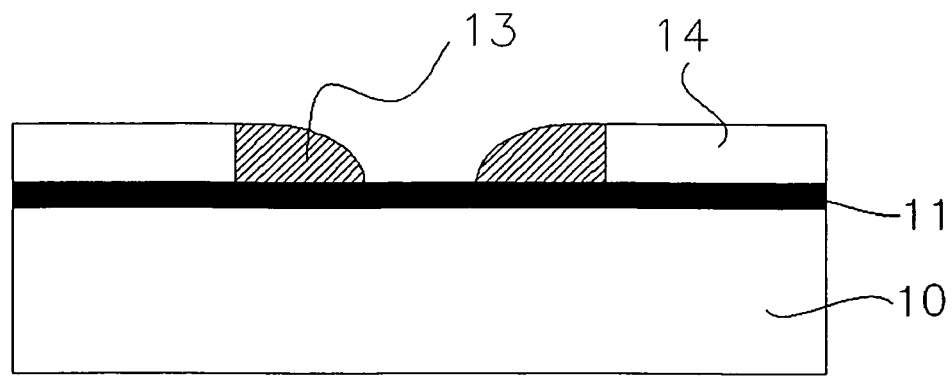

Referring to FIG. 2c, a silicon epitaxial layer 14 is formed over the inversion epitaxial layer 11, but not on the area covered by the hard mask. The hard mask is then removed to form a trench through the silicon epitaxial layer 14. The trench is filled with an insulating layer. The insulating layer is then dry-etched to form reverse spacers 13 on the sidewalls of the trench. In the illustrated example process, the width of the trench is smaller than the width of a gate electrode to be formed by a later unit process. The insulating layer is preferably a single layer of tetra ethyl ortho silicate (TEOS) or a multi-layer of TEOS-SiN-TEOS.

Figure 2D:
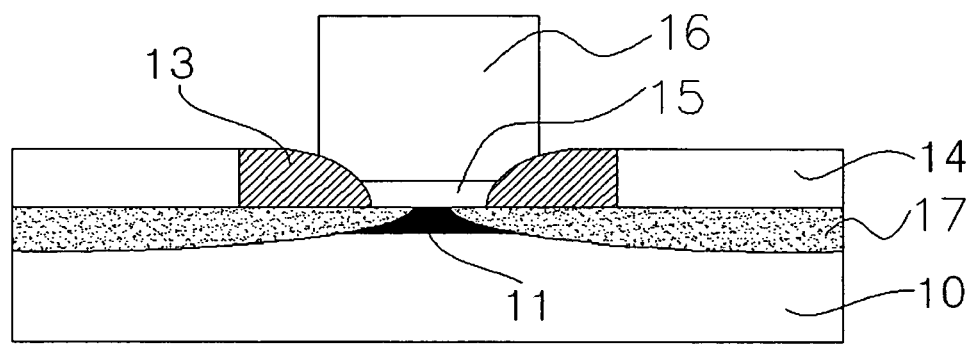

Referring to FIG. 2d, an oxide layer and a polysilicon layer are sequentially deposited over the structure of FIG. 2c. Some portion(s) of the oxide layer and the polysilicon layer are removed by using a dry etching process to complete a gate oxide 15 and a gate electrode 16. The gate electrode 16 is positioned above the inversion epitaxial layer between the reverse spacers. In the illustrated example process, the width of the gate electrode 16 is smaller than the width of the trench, but larger than the space between the reverse spacers 13. The length of a channel under the gate electrode 16 is defined as the length of the SSR epitaxial channel 11 between the reverse spacers 13. By forming the reverse spacers 13 on the area for the gate electrode 16, the illustrated example process can considerably reduce the length of the channel compared to a conventional process which forms a channel having the same length as the gate electrode. Therefore, the illustrated example process is applicable to a fabrication process for a less than 90 nm transistor.

Next, pocket-well regions (not shown) and lightly doped drain (LDD) regions 17 are formed in the silicon substrate 10 by performing a first ion implantation process. Generally, conventional technology must implant low energy ions in order to form a shallow junction to prevent a leakage current of the junction area. However, the illustrated example process can form a shallow junction even when high energy ions are implanted because the silicon epitaxial layer 14 and the reverse spacers 13 on the inversion epitaxial layer 11 function as a buffer layer during the first ion implantation.

Figure 2E:
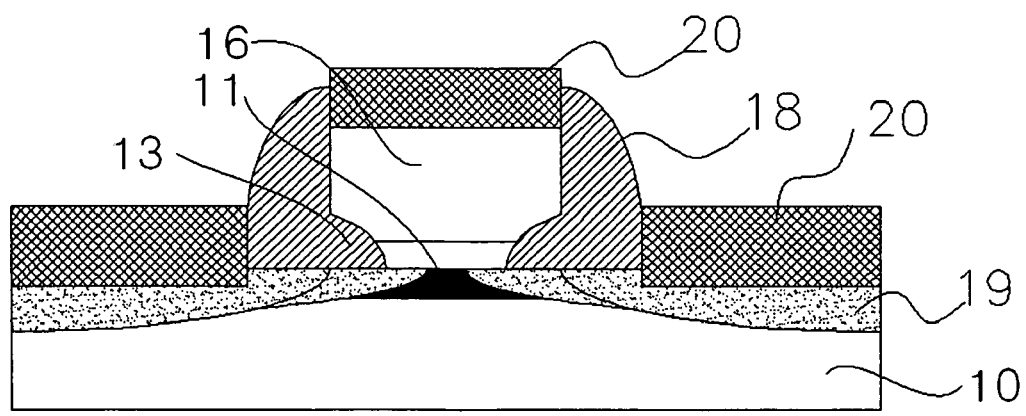

Referring to FIG. 2e, an insulating layer is deposited over the structure of FIG. 2d. An etching process is performed to form gate spacers 18 on the sidewalls of the gate electrode 16. A second ion implantation process is then performed using the gate electrode 16 and the gate spacers 18 as a mask to form deep source and drain regions 19 in the silicon substrate 10. Particularly, the illustrated example process may form elevated source and drain regions because the second ion implantation process may implant ions into the silicon epitaxial layer 14 on the source and drain regions 19. Moreover, because the silicon epitaxial layer 14 functions as a buffer layer during the second ion implantation process, the described example process achieves the shallow junction necessary for a nanometer scale transistor design, thereby obviating the problem of parasitic capacitance due to the formation of the shallow junction. Subsequently, a silicide layer 20 is respectively formed on the gate electrode 16 and on the source drain regions 19 by using a known unit process.

Consequently, a MOS transistor comprising an inversion epitaxial layer as an SSR epitaxial channel and elevated source and drain regions is completed. In detail, as shown in FIG. 2e, after an inversion epitaxial layer is formed on a semiconductor substrate, a trench is placed over the inversion epitaxial layer and reverse spacers are positioned on the sidewalls of the trench. After a gate electrode is positioned above the inversion epitaxial layer between the reverse spacers, gate spacers are placed on the sidewalls of the gate electrode. Pocket-well regions are formed under opposite sides of the gate electrode in the silicon substrate, and LDD regions are positioned adjacent the upper part of the pocket-well regions and the inversion epitaxial layer over the pocket-well regions. Source and drain regions, (which have a larger thickness than the LDD regions), are positioned adjacent the LDD regions in the silicon substrate. A silicide layer is positioned on the gate electrode and through the silicon epitaxial layer on the source and drain regions, respectively.

From the foregoing, persons of ordinary skill in the art will appreciate that the disclosed methods of fabricating a transistor of a semiconductor device simplify the manufacturing process and reduce production costs because they use an existing gate fabrication process. In other words, by depositing a silicon epitaxial layer before source and drain regions are formed in a silicon substrate and performing ion implantation processes, the disclosed methods simplify the manufacturing process in comparison with a conventional selective epitaxial growth process requiring an additional ion implantation process.

From the foregoing, persons of ordinary skill in the art will further appreciate that, by forming an SSR epitaxial channel, a silicon epitaxial layer, and reverse spacers, the disclosed methods of fabricating a transistor of a semiconductor device reduce parasitic capacitance and a junction leakage current of a nanometer scale MOS transistors.

It is noted that this patent claims priority from Korean Patent Application Serial Number 10-2003-0102038, which was filed on Dec. 31, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A transistor comprising;
an inversion epitaxial layer on a silicon substrate;
a silicon epitaxial layer having a trench formed over the inversion epitaxial layer;
reverse spacers on sidewalls of the trench;
a gate electrode above the inversion epitaxial layer between the reverse spacers;
spacers on the sidewalls of the gate electrode;
pocket-well regions under opposite sides of the gate electrode;
LDD regions positioned adjacent respective ones of the pocket-well regions;
source and drain regions positioned adjacent the LDD regions, the source and drain regions having a larger thickness than the LDD regions; and
a silicide layer positioned on the gate electrode and the source and drain regions.

2. The transistor as defined by claim 1, wherein the inversion epitaxial layer is used as an SSR epitaxial channel.

3. The transistor as defined by claim 1, wherein a gate channel is located under the gate electrode, the gate channel having a length defined by a length of the inversion epitaxial layer exposed between the reverse spacers.

4. The transistor as defined by claim 1, wherein the gate electrode has a width smaller than the trench and larger than a space between the reverse spacers.

5. The transistor as defined by claim 1, wherein the silicon epitaxial layer is ion-implanted above the source and drain regions to function as elevated source and drain regions.

* * * * *